United States Patent
Hwang et al.

(10) Patent No.: US 12,476,179 B2
(45) Date of Patent: Nov. 18, 2025

(54) SEMICONDUCTOR PACKAGE INCLUDING THROUGH-SILICON VIA AND METHOD OF FORMING THE SAME

(71) Applicant: SAMSUNG ELECTRONICS CO., LTD., Suwon-si (KR)

(72) Inventors: Inhyo Hwang, Asan-si (KR);
Younglyong Kim, Anyang-si (KR);
Hyunsoo Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 573 days.

(21) Appl. No.: 17/871,449

(22) Filed: Jul. 22, 2022

(65) Prior Publication Data
US 2023/0126686 A1  Apr. 27, 2023

(30) Foreign Application Priority Data
Oct. 21, 2021  (KR) .................... 10-2021-0140995

(51) Int. Cl.
*H01L 23/498* (2006.01)
*H01L 23/00* (2006.01)
(Continued)

(52) U.S. Cl.
CPC .. *H01L 23/49827* (2013.01); *H01L 23/49838* (2013.01); *H01L 24/16* (2013.01);
(Continued)

(58) Field of Classification Search
None
See application file for complete search history.

(56) References Cited

U.S. PATENT DOCUMENTS 6,714,418 B2  3/2004  Frankowsky et al.
7,919,844 B2  4/2011  Ozguz et al.
(Continued)

FOREIGN PATENT DOCUMENTS

KR  10-2011-0044963 A  5/2011
KR  10-2015-0085763 A  7/2015
(Continued)

*Primary Examiner* — Hung K Vu
(74) *Attorney, Agent, or Firm* — Sughrue Mion, PLLC

(57) ABSTRACT

A semiconductor package includes a package substrate and a plurality of sub-packages provided on the package substrate. Each of the plurality of sub-packages includes a semiconductor chip, an interposer provided adjacent to the semiconductor chip, the interposer including a plurality of first through-silicon vias, an encapsulator provided between the semiconductor chip and the interposer, and a redistribution layer provided on the interposer, the encapsulator and the semiconductor chip. The semiconductor chip includes a semiconductor substrate having a first surface and a second surface opposite the first surface and a plurality of chip pads provided on the first surface. The redistribution layer includes a plurality of redistribution pads and a horizontal wiring provided between the plurality of redistribution pads and the plurality of first through-silicon vias. The redistribution layer is provided on the second surface of the semiconductor substrate, and extends on the encapsulator and the interposer.

20 Claims, 21 Drawing Sheets

(51) Int. Cl.
*H01L 25/00* (2006.01)
*H01L 25/065* (2023.01)

(52) U.S. Cl.
CPC ...... *H01L 25/0652* (2013.01); *H01L 25/0657* (2013.01); *H01L 25/50* (2013.01); *H01L 2224/16147* (2013.01); *H01L 2224/16227* (2013.01); *H01L 2224/16237* (2013.01); *H01L 2225/06513* (2013.01); *H01L 2225/06517* (2013.01); *H01L 2225/06544* (2013.01); *H01L 2924/182* (2013.01)

(56) References Cited

U.S. PATENT DOCUMENTS

| | | |
|---|---|---|
| 8,203,204 B2 | 6/2012 | Kim |
| 9,153,517 B2 | 10/2015 | Co et al. |
| 9,711,482 B2 | 7/2017 | Lee et al. |
| 10,714,462 B2 | 7/2020 | Bhagavat et al. |
| 2010/0133704 A1* | 6/2010 | Marimuthu ......... H01L 23/3128 257/E23.116 |
| 2015/0200182 A1 | 7/2015 | Wang et al. |
| 2020/0111764 A1 | 4/2020 | Kim et al. |
| 2020/0126919 A1 | 4/2020 | Kang et al. |
| 2021/0043608 A1 | 2/2021 | Yu et al. |
| 2021/0193622 A1 | 6/2021 | Choi |

FOREIGN PATENT DOCUMENTS

| | | |
|---|---|---|
| KR | 10-2020-0043716 A | 4/2020 |
| KR | 10-2021-0082030 A | 7/2021 |

* cited by examiner

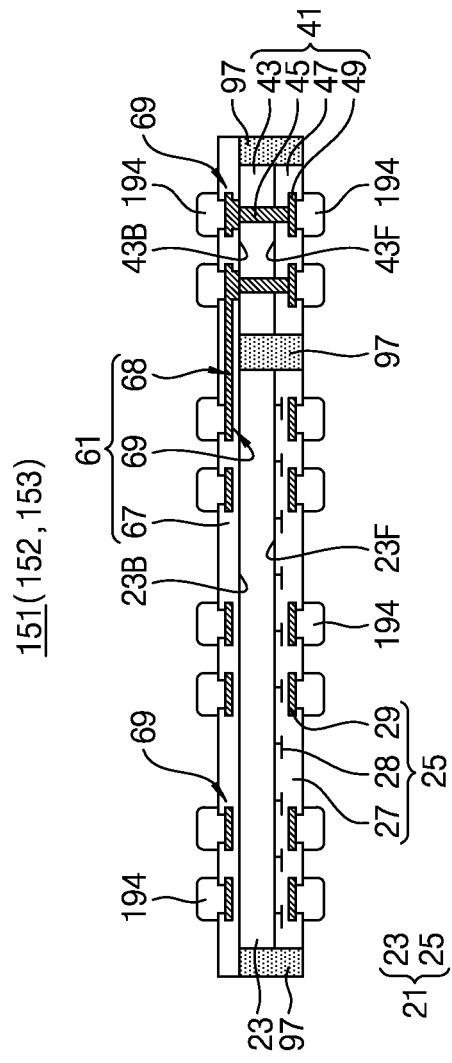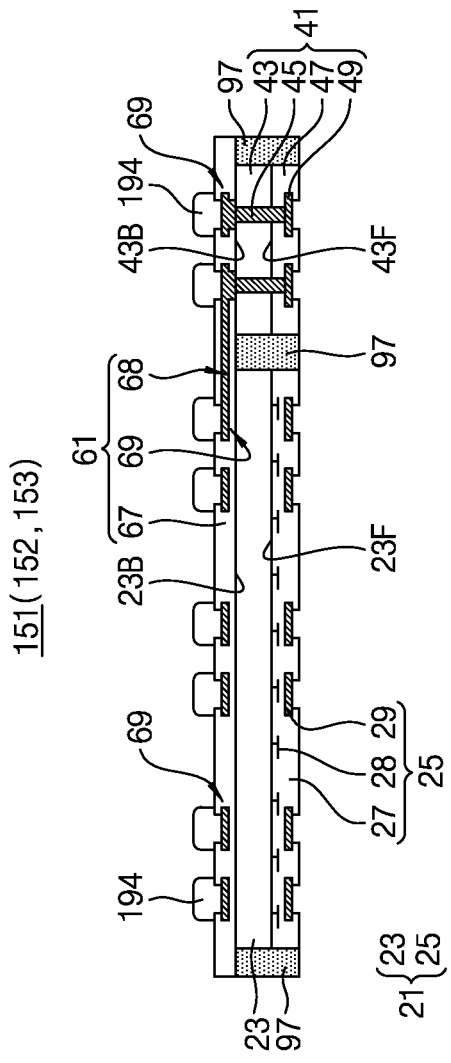

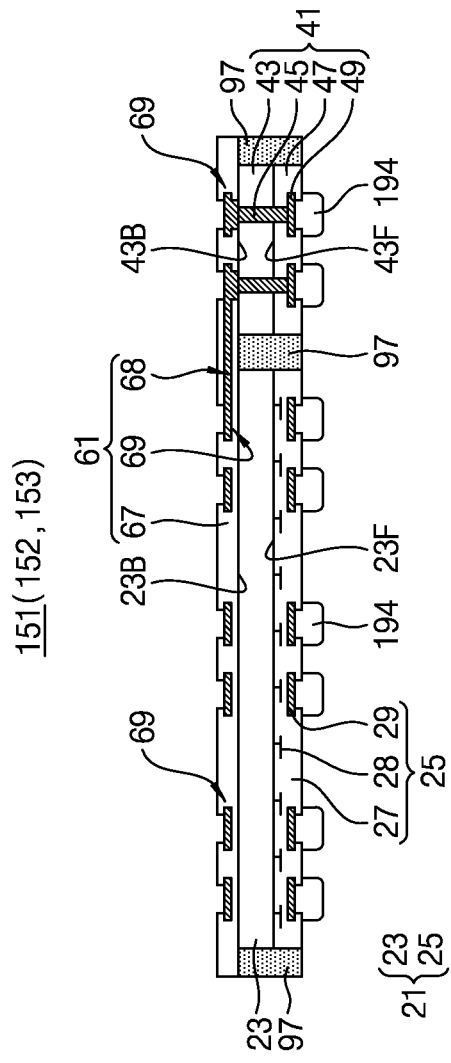
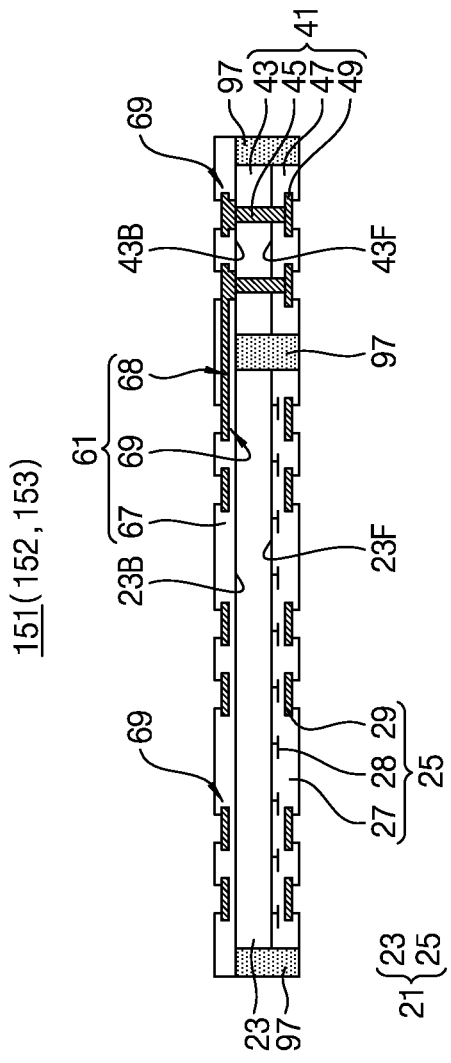

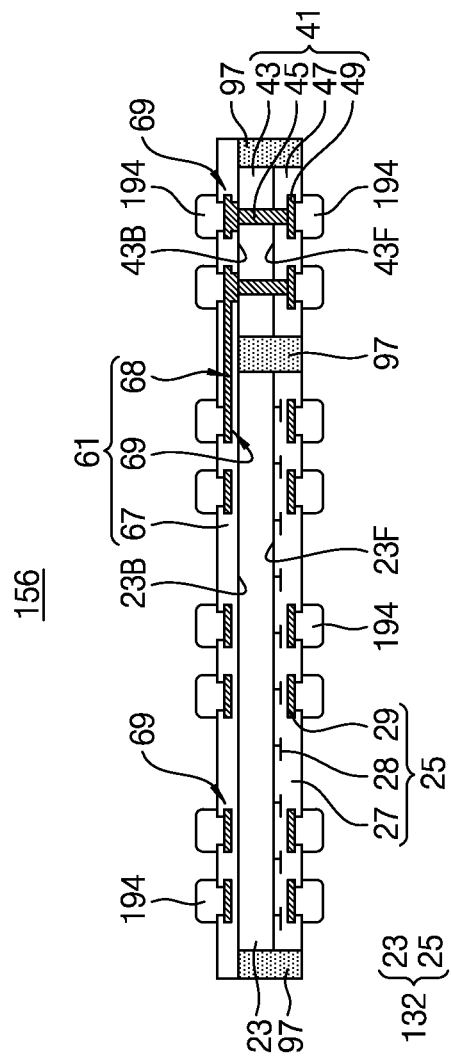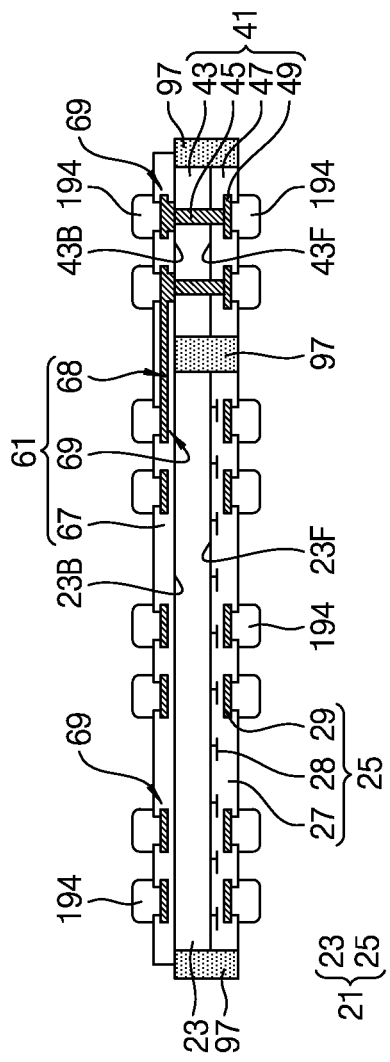

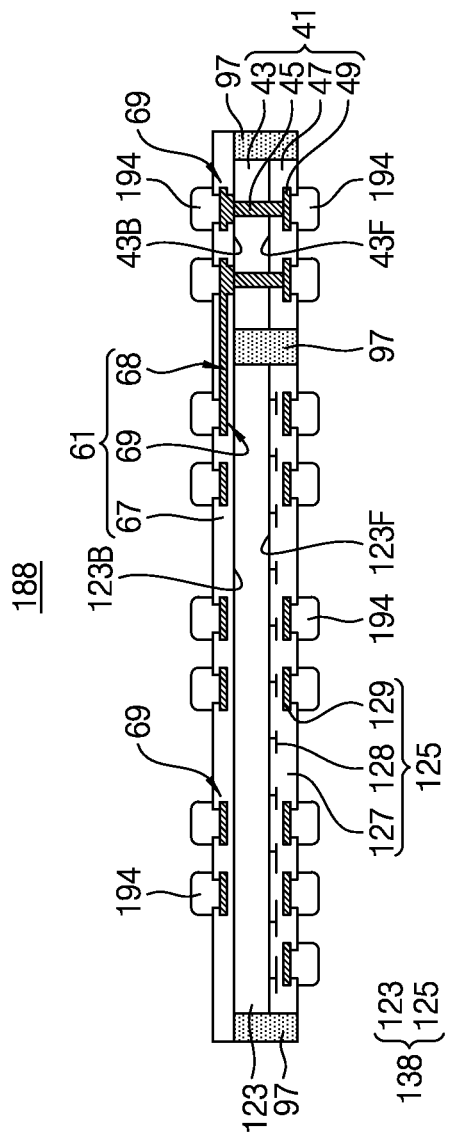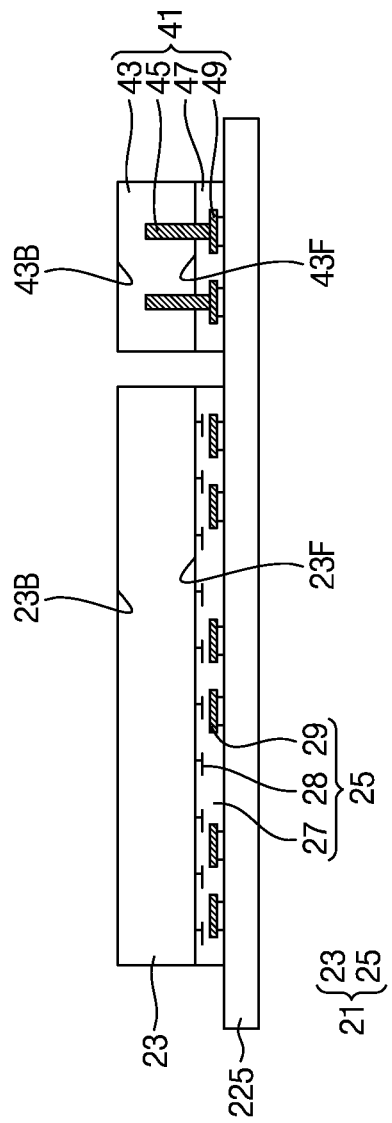

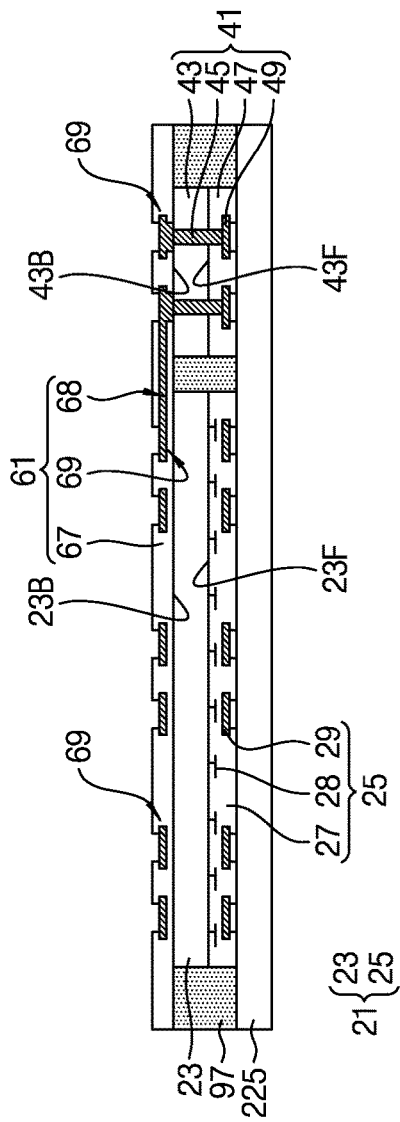

SEMICONDUCTOR PACKAGE INCLUDING THROUGH-SILICON VIA AND METHOD OF FORMING THE SAME

CROSS-REFERENCE TO THE RELATED APPLICATION

This application is based on and claims priority under 35 U.S.C. § 119 to Korean Patent Application No. 10-2021-0140995, filed on Oct. 21, 2021, in the Korean Intellectual Property Office, the disclosure of which is incorporated by reference herein in its entirety.

BACKGROUND

1. Field

The example embodiments of the disclosure relate to a semiconductor package including a through-silicon via and a method of forming the same.

2. Description of the Related Art

In accordance with demand for high integration of a semiconductor package, technology for mounting a plurality of semiconductor chips in one package is being developed. The plurality of semiconductor chips in the semiconductor package should be electrically interconnected. The minimum size of the semiconductor package may be determined depending on a method of electrically interconnecting the plurality of semiconductor chips. Manufacturing costs of the semiconductor package may be determined depending on a method of electrically interconnecting the plurality of semiconductor chips.

Research on technology for disposing a plurality of through-silicon vias in each of the plurality of semiconductor chips is being conducted. The technology for disposing the plurality of through-silicon vias in the chip may cause an increase in chip size. A process of forming the plurality of through-silicon vias may degrade the production efficiency of the plurality of semiconductor chips. The constituent material of the plurality of through-silicon vias may adversely affect electrical characteristics and reliability of the plurality of semiconductor chips.

SUMMARY

Example embodiments provide a semiconductor package which may have excellent electrical characteristics while being advantageous in terms of lightness, thinness, simplification and miniaturization, and a method of forming the same.

According to an aspect of an example embodiment, there is provided a semiconductor package including: a package substrate; and a plurality of sub-packages provided on the package substrate, wherein each sub-package of the plurality of sub-packages includes: a semiconductor chip; an interposer provided adjacent to the semiconductor chip, the interposer including a plurality of first through-silicon vias; an encapsulator provided between the semiconductor chip and the interposer; and a redistribution layer provided on the interposer, the encapsulator and the semiconductor chip, wherein the semiconductor chip includes: a semiconductor substrate having a first surface and a second surface opposite the first surface; and a plurality of chip pads provided on the first surface, wherein the redistribution layer includes: a plurality of redistribution pads; and a horizontal wiring provided between the plurality of redistribution pads and the plurality of first through-silicon vias, and wherein the redistribution layer is provided on the second surface of the semiconductor substrate, and extends on the encapsulator and the interposer.

According to an aspect of an example embodiment, there is provided a semiconductor package including: a package substrate; a first semiconductor chip provided on the package substrate; a second semiconductor chip provided on the package substrate adjacent to the first semiconductor chip; and a plurality of sub-packages provided on the first semiconductor chip and the second semiconductor chip, wherein each sub-package of the plurality of sub-packages includes: a third semiconductor chip; a passive interposer provided adjacent to the third semiconductor chip, the passive interposer including a plurality of first through-silicon vias; an encapsulator provided between the third semiconductor chip and the passive interposer; and a redistribution layer provided on the passive interposer, the encapsulator and the third semiconductor chip, wherein the third semiconductor chip includes: a semiconductor substrate having a first surface and a second surface opposite the first surface; and a plurality of chip pads provided on the first surface, wherein the redistribution layer includes: a plurality of redistribution pads; and a horizontal wiring provided between the plurality of redistribution pads and the plurality of first through-silicon vias, and wherein the redistribution layer is provided on the second surface of the semiconductor substrate, and extends on the encapsulator and the passive interposer.

According to an aspect of an example embodiment, there is provided a semiconductor package including: a semiconductor chip; a passive interposer provided adjacent to the semiconductor chip, the passive interposer including a plurality of through-silicon vias; an encapsulator provided between the semiconductor chip and the passive interposer; and a redistribution layer provided on the passive interposer, the encapsulator and the semiconductor chip, wherein the semiconductor chip includes: a semiconductor substrate including a first surface, and a second surface opposite the first surface; and a plurality of chip pads on the first surface, wherein the redistribution layer includes: a plurality of redistribution pads; and a horizontal wiring provided between the plurality of redistribution pads and the plurality of through-silicon vias, wherein the redistribution layer is provided on the second surface of the semiconductor substrate, and extends on the encapsulator and the passive interposer, and wherein each chip pad of the plurality of chip pads is aligned with a corresponding redistribution pad of the plurality of redistribution pads.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 1, 2, 3, 4, 5, 6, 7, 8, 9, 10, 11, 12, 13, 14, 15 and 16 are sectional views of semiconductor packages according to example embodiments.

FIGS. 17, 18, 19, 20, 21, 22, 23, 24, 25, 26, 27, 28, 29, 30 and 31 are sectional views of semiconductor package formation methods according to example embodiments.

DETAILED DESCRIPTION

Figure 1:
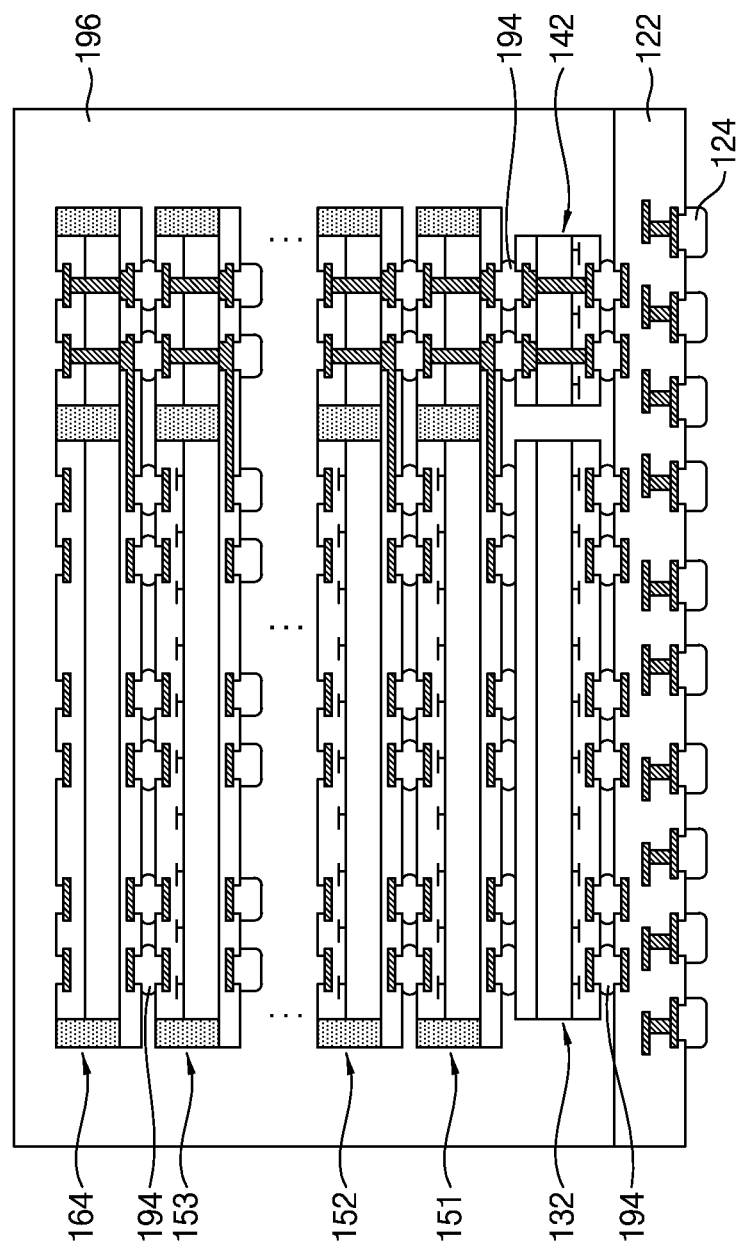

FIG. 1 is a sectional view of semiconductor packages according to an example embodiment.

Referring to FIG. 1, the semiconductor packages according to the example embodiments of the disclosure may include a package substrate 122, a plurality of outer connection terminals 124, a first semiconductor chip 132, a second semiconductor chip 142, a first semiconductor package (or first semiconductor sub-package) 151, a second semiconductor package (or second semiconductor sub-package) 152, a third semiconductor package (or third semiconductor sub-package) 153, a fourth semiconductor package (or fourth semiconductor sub-package) 164, a plurality of inner connection terminals 194, and an outer encapsulator 196 (the first, second, third, fourth, fifth, sixth, seventh, eighth, and other semiconductor packages may be referred to as "sub-packages" as well).

FIGS. 2, 3, 4, 5, 6, 7, 8 and 9 are sectional views of semiconductor packages according to example embodiments.

Referring to FIG. 2, the semiconductor packages according to the example embodiments of the disclosure may include a first semiconductor package 151. The first semiconductor package 151 may include a third semiconductor chip 21, a passive interposer 41, a redistribution layer 61, and an inner encapsulator 97.

The third semiconductor chip 21 may include a first semiconductor substrate 23 and a first circuit layer 25. The first semiconductor substrate 23 may include a first surface 23F and a second surface 23B. The first circuit layer 25 may include a first chip insulating layer 27, a plurality of first active/passive devices 28, and a plurality of first chip pads 29. The passive interposer 41 may include an interposer substrate 43, a plurality of first through-silicon vias 45, an interposer insulating layer 47, and a plurality of interposer pads 49. The interposer substrate 43 may include a front surface 43F and a back surface 43B.

The redistribution layer 61 may include a redistribution insulating layer 67, a horizontal wiring 68, and a plurality of redistribution pads 69. In an embodiment, side surfaces of the redistribution layer 61 and the inner encapsulator 67 may be substantially coplanar. A plurality of inner connection terminals 194 may be disposed on the plurality of first chip pads 29, the plurality of interposer pads 49, and the plurality of redistribution pads 69.

The third semiconductor chip 21 may include a volatile memory, a non-volatile memory, a microprocessor, a buffer chip, an application processor, a logic chip, or a combination thereof. In an embodiment, the third semiconductor chip 21 may include dynamic random access memory (RAM) (DRAM), static RAM (SRAM), flash memory, electrically erasable programmable read-only memory (ROM) (EEPROM), phase-change RAM (PRAM), magnetoresistive RAM (MRAM), resistive RAM (RRAM), or a combination thereof. For example, the third semiconductor chip 21 may include a non-volatile memory such as VNAND.

The plurality of first active/passive devices 28 may include a transistor, a diode, a capacitor, a variable resistor, a resistor, interconnections, or a combination thereof. In an embodiment, the plurality of first active/passive devices 28 may include at least one active device such as a transistor.

The passive interposer 41 may be a device including no active device. The passive interposer 41 may include a deactivated active device such as a dummy chip. When the passive interposer 41 includes a deactivated active device, the plurality of interposer pads 49 and the plurality of first through-silicon vias 45 may be insulated from the deactivated active device. The plurality of interposer pads 49 and the plurality of first through-silicon vias 45 may be electrically separated from the deactivated active device.

Referring to FIG. 3, the plurality of inner connection terminals 194 may be disposed on the plurality of redistribution pads 69. The plurality of first chip pads 29 and the plurality of interposer pads 49 may be exposed.

Referring to FIG. 4, the plurality of inner connection terminals 194 may be disposed on the plurality of first chip pads 29 and the plurality of interposer pads 49. The plurality of redistribution pads 69 may be exposed.

Referring to FIG. 5, the plurality of first chip pads 29, the plurality of interposer pads 49, and the plurality of redistribution pads 69 may be exposed.

Figure 6:
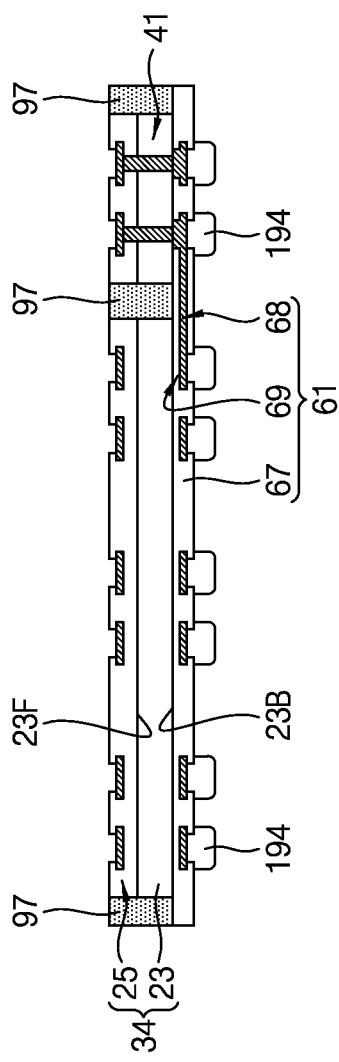

Referring to FIG. 6, the semiconductor packages according to the example embodiments of the disclosure may include a fourth semiconductor package 164. The fourth semiconductor package 164 may include a fourth semiconductor chip 34, a passive interposer 41, a redistribution layer 61, and an inner encapsulator 97. The fourth semiconductor chip 34 may include a first semiconductor substrate 23 and a first circuit layer 25. In an embodiment, the fourth semiconductor chip 34 may be a dummy chip.

Figure 7:
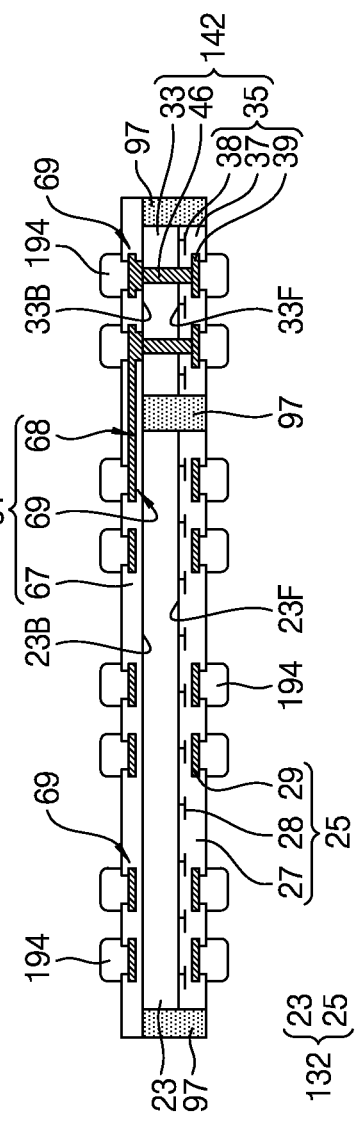

Referring to FIG. 7, the semiconductor packages according to the example embodiments of the disclosure may include a fifth semiconductor package 175. The fifth semiconductor package 175 may include a first semiconductor chip 132, a second semiconductor chip 142, a redistribution layer 61, and an inner encapsulator 97.

The first semiconductor chip 132 may include a configuration similar to the configuration of the third semiconductor chip 21 in FIG. 2. In an embodiment, the first semiconductor chip 132 may include a first semiconductor substrate 23 and a first circuit layer 25. The first semiconductor substrate 23 may include a first surface 23F and a second surface 23B. The first circuit layer 25 may include a first chip insulating layer 27, a plurality of first active/passive devices 28, and a plurality of first chip pads 29.

The second semiconductor chip 142 may include a second semiconductor substrate 33, a second circuit layer 35, and a plurality of second through-silicon vias 46. The second semiconductor substrate 33 may include a first surface 33F and a second surface 33B. The second circuit layer 35 may include a second chip insulating layer 37, a plurality of second active/passive devices 38, and a plurality of second chip pads 39. The plurality of second chip pads 39 may be connected to the plurality of second through-silicon vias 46. The second redistribution layer 61 may include a redistribution insulating layer 67, a horizontal wiring 68, and a plurality of redistribution pads 69. The horizontal wiring 68 may be connected to the plurality of second through-silicon vias 46.

Each of the plurality of first chip pads 29 of the first semiconductor chips 132 may be vertically aligned with a corresponding one of the plurality of redistribution pads 69 in the fifth semiconductor package 175. The plurality of first chip pads 29 may have substantially the same pitch as the plurality of redistribution pads 69.

In an embodiment, the second semiconductor chip 142 may include a controller chip, a buffer chip, a logic chip, a microprocessor, an application processor, a graphics processing unit, or a combination thereof.

The plurality of second active/passive devices 38 may include a transistor, a diode, a capacitor, a variable resistor, a resistor, interconnections, or a combination thereof. In an embodiment, the plurality of second active/passive devices 38 may include at least one active device such as a transistor. The plurality of second active/passive devices 38 may be electrically connected to the plurality of second chip pads 39 and the plurality of second through-silicon vias 46.

Referring to FIG. 8, the semiconductor packages according to the example embodiments of the disclosure may include a sixth semiconductor package 156. The sixth semiconductor package 156 may include a first semiconductor chip 132, a passive interposer 41, a redistribution layer 61, and an inner encapsulator 97.

The first semiconductor chip 132 may include a configuration similar to the configuration of the third semiconductor chip 21 in FIG. 2. In an embodiment, the first semiconductor chip 132 may include a first semiconductor substrate 23 and a first circuit layer 25. The first semiconductor substrate 23 may include a first surface 23F and a second surface 23B. The first circuit layer 25 may include a first chip insulating layer 27, a plurality of first active/passive devices 28, and a plurality of first chip pads 29.

The passive interposer 41 may include an interposer substrate 43, a plurality of first through-silicon vias 45, an interposer insulating layer 47, and a plurality of interposer pads 49. The interposer substrate 43 may include a front surface 43F and a back surface 43B. The redistribution layer 61 may include a redistribution insulating layer 67, a horizontal wiring 68, and a plurality of redistribution pads 69. A plurality of inner connection terminals 194 may be disposed on the plurality of first chip pads 29, the plurality of interposer pads 49, and the plurality of redistribution pads 69.

Referring to FIG. 9, in an embodiment, side surfaces of the redistribution layer 61 may be misaligned from side surfaces of the inner encapsulator 97.

Again referring to FIGS. 1 to 9, the package substrate 122 may include a rigid printed circuit board, a flexible printed circuit board, a rigid-flexible printed circuit board, an interposer, or a combination thereof. The package substrate 122 may include a multilayer circuit board. The plurality of outer connection terminals 124 may be disposed at a lower surface of the package substrate 122. The plurality of outer connection terminals 124 may include Sn, Ag, Cu, Al, AlN, Au, Be, Bi, Co, Hf, In, Mn, Mo, Ni, Pb, Pd, Pt, Rh, Re, Ru, Ta, TaN, Te, Ti, TiN, W, WN, Zn, Zr, or a combination thereof. The plurality of outer connection terminals 124 may include a conductive bump, a conductive ball, a conductive pin, a conductive lead, a conductive pillar, or a combination thereof. For example, each of the plurality of outer connection terminals 124 may include an under bump metal (UBM) or a conductive bump.

The first semiconductor chip 132 and the second semiconductor chip 142 may be mounted on the package substrate 122. The plurality of inner connection terminals 194 may be disposed between the first semiconductor chip 132 and the package substrate 122 and between the second semiconductor chip 142 and the package substrate 122. Each of the first semiconductor chip 132 and the second semiconductor chip 142 may include a configuration similar to the configuration described with reference to FIG. 7.

The first semiconductor package 151, the second semiconductor package 152, the third semiconductor package 153, and the fourth semiconductor package 164 may be sequentially stacked on the first semiconductor chip 132 and the second semiconductor chip 142. The plurality of inner connection terminals 194 may be disposed among the first semiconductor package 151, the second semiconductor package 152, the third semiconductor package 153, and the fourth semiconductor package 164. The plurality of inner connection terminals 194 may be disposed between the first semiconductor chip 132 and the first semiconductor package 151 and between the second semiconductor chip 142 and the first semiconductor package 151.

The first semiconductor package 151 may include a configuration similar to the configuration described with reference to FIGS. 2 to 5. Each of the second semiconductor package 152 and the third semiconductor package 153 may include a configuration similar to that of the first semiconductor package 151. One or a plurality of other semiconductor packages (for example, a package having a configuration similar to that of the first semiconductor package 151) may be additionally stacked between the second semiconductor package 152 and the third semiconductor package 153. The fourth semiconductor package 164 may include a configuration similar to the configuration described with reference to FIG. 6.

The outer encapsulator 196, which covers the first semiconductor chip 132, the second semiconductor chip 142, the first semiconductor package 151, the second semiconductor package 152, the third semiconductor package 153, and the fourth semiconductor package 164, may be disposed on the package substrate 122.

In an embodiment, the plurality of first chip pads 29 in the first semiconductor package 151 may be electrically connected to the plurality of first through-silicon vias 45 in the first semiconductor package 151 via the plurality of inner connection terminals 194, the plurality of redistribution pads 69 in the second semiconductor package 152, and the horizontal wiring 68 in the second semiconductor package 152. The plurality of first through-silicon vias 45 in the first semiconductor package 151 may be electrically connected to the plurality of second through-silicon vias 46 in the second semiconductor chip 142 via the plurality of inner connection terminals 194. The plurality of first through-silicon vias 45 may be vertically aligned with the plurality of second through-silicon vias 46 in plan view.

In an embodiment, the plurality of first chip pads 29 in the third semiconductor package 153 may be electrically connected to the plurality of first through-silicon vias 45 in the third semiconductor package 153 via the plurality of inner connection terminals 194, the plurality of redistribution pads 69 in the fourth semiconductor package 164, and the horizontal wiring 68 in the fourth semiconductor package 164. The plurality of first through-silicon vias 45 in the third semiconductor package 153 may be electrically connected to the plurality of second through-silicon vias 46 in the second semiconductor chip 142. The plurality of first through-silicon vias 45 in the third semiconductor package 153 may be vertically aligned with the plurality of second through-silicon vias 46 in the second semiconductor chip 142 in plan view.

FIGS. 10, 11, 12, 13, 14, 15 and 16 are sectional views of semiconductor packages according to example embodiments.

Figure 10:
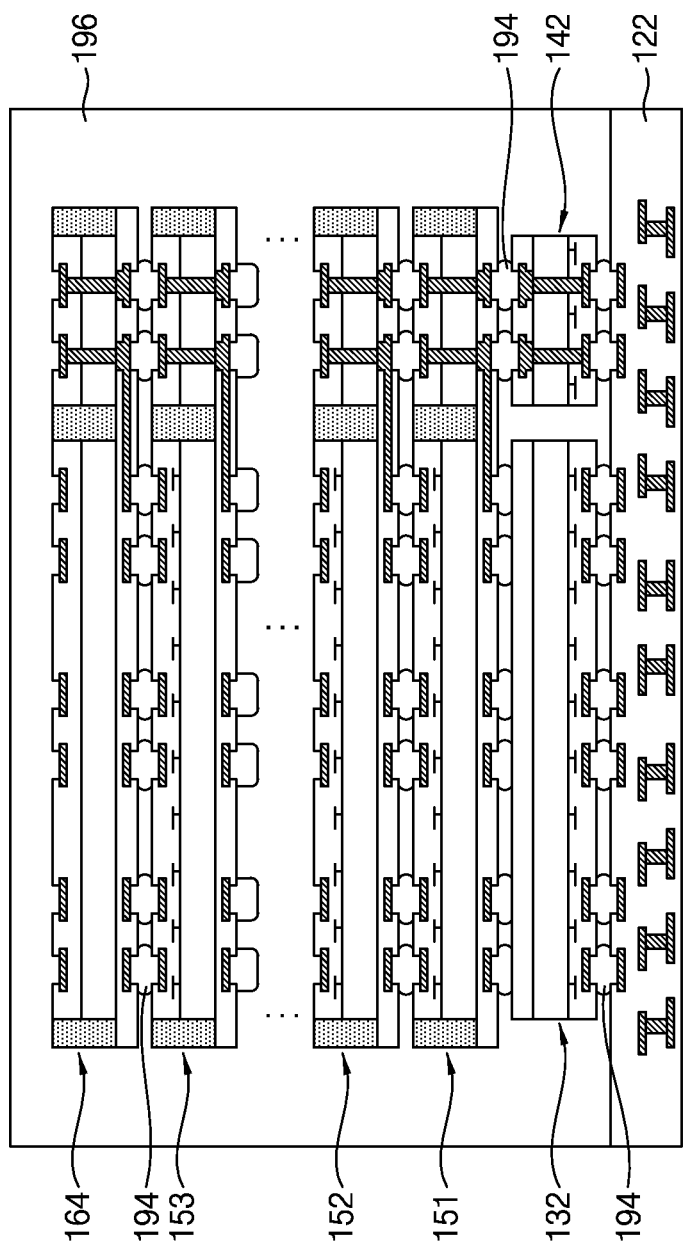

Referring to FIG. 10, the semiconductor packages according to the example embodiments of the disclosure may include a package substrate 122, a first semiconductor chip 132, a second semiconductor chip 142, a first semiconductor package 151, a second semiconductor package 152, a third semiconductor package 153, a fourth semiconductor package 164, a plurality of inner connection terminals 194, and an outer encapsulator 196. The plurality of outer connection terminals 124 in FIG. 1 may be omitted.

Figure 11:
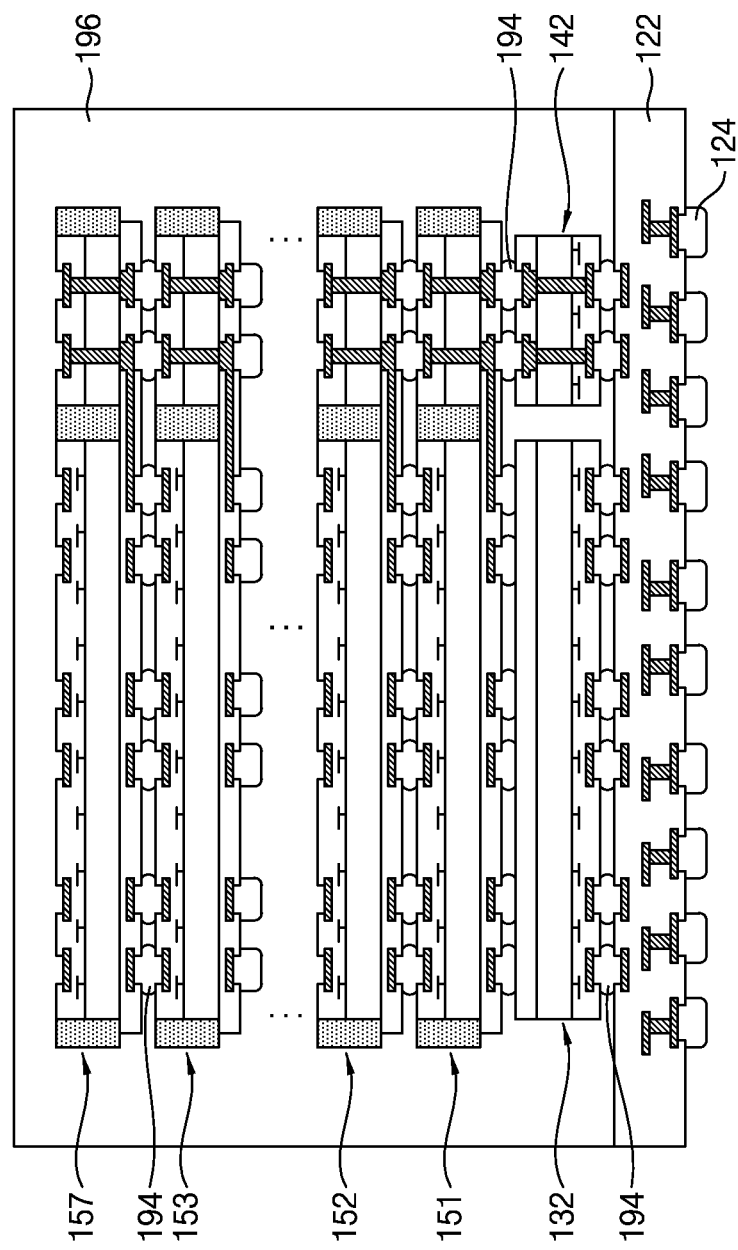

Referring to FIG. 11, the semiconductor packages according to the example embodiments of the disclosure may include a package substrate 122, a plurality of outer connection terminals 124, a first semiconductor chip 132, a second semiconductor chip 142, a first semiconductor package 151, a second semiconductor package 152, a third semiconductor package 153, a seventh semiconductor package 157, a plurality of inner connection terminals 194, and an outer encapsulator 196. The seventh semiconductor package 157 may include a configuration similar to that of the first semiconductor package 151 described with reference to FIG. 3.

Figure 12:
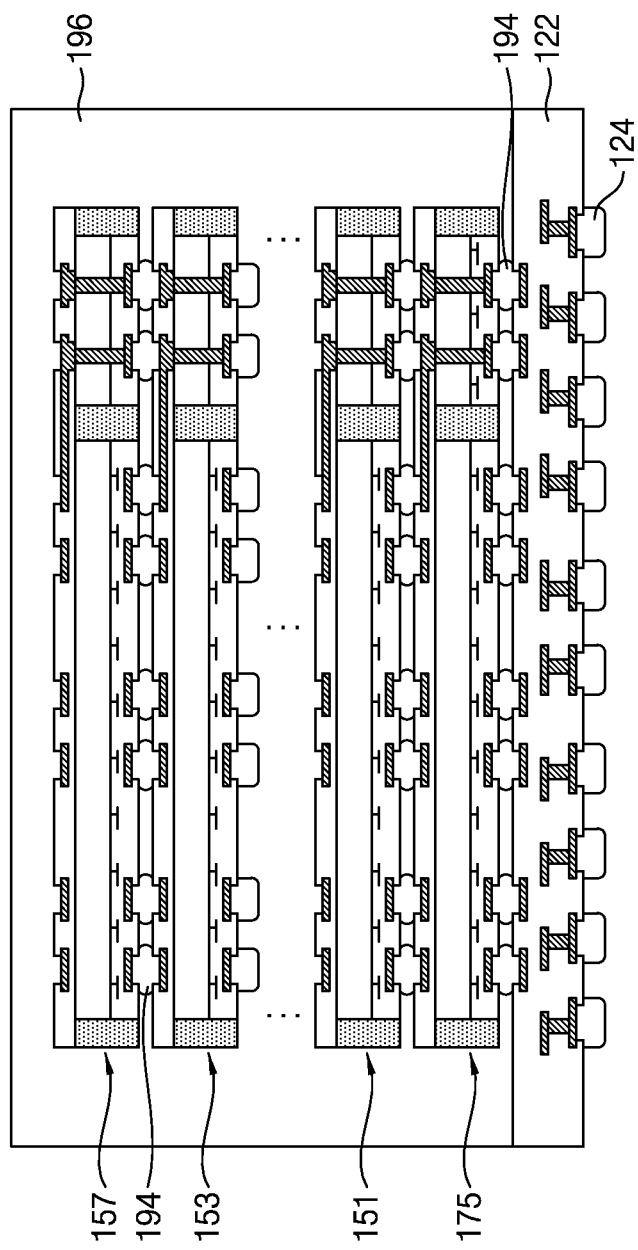

Referring to FIG. 12, the semiconductor packages according to the example embodiments of the disclosure may include a package substrate 122, a plurality of outer connection terminals 124, a first semiconductor package 151, a third semiconductor package 153, a fifth semiconductor package 175, a seventh semiconductor package 157, a plurality of inner connection terminals 194, and an outer encapsulator 196.

The fifth semiconductor package 175 may be disposed between the first semiconductor package 151 and the package substrate 122. The plurality of inner connection terminals 194 may be disposed between the first semiconductor package 151 and the fifth semiconductor package 175 and between the fifth semiconductor package 175 and the package substrate 122. The fifth semiconductor package 175 may include a configuration similar to the configuration described with reference to FIG. 7.

In an embodiment, the plurality of inner connection terminals 194 may be disposed between the plurality of first chip pads 29 in the fifth semiconductor package 175 and the package substrate 122 and between the plurality of second chip pads 39 and the package substrate 122. The plurality of chip pads 29 in the first semiconductor package 151 may be electrically connected to the plurality of second through-silicon vias 46 in the fifth semiconductor package 175 via the plurality of inner connection terminals 194, the plurality of redistribution pads 69 in the fifth semiconductor package 175, and the horizontal wiring 68 in the fifth semiconductor package 175.

The seventh semiconductor package 157 may include a configuration similar to that of the first semiconductor package 151 described with reference to FIG. 4. The seventh semiconductor package 157 may be disposed on the third semiconductor package 153.

In an embodiment, the plurality of chip pads 29 in the seventh semiconductor package 157 may be electrically connected to the plurality of first through-silicon vias 45 in the third semiconductor package 153 via the plurality of inner connection terminals 194, the plurality of redistribution pads 69 in the third semiconductor package 153, and the horizontal wiring 68 in the third semiconductor package 153. The plurality of first through-silicon vias 45 may be vertically aligned with the plurality of second through-silicon vias 46 in the fifth semiconductor package 175 in plan view.

Figure 13:
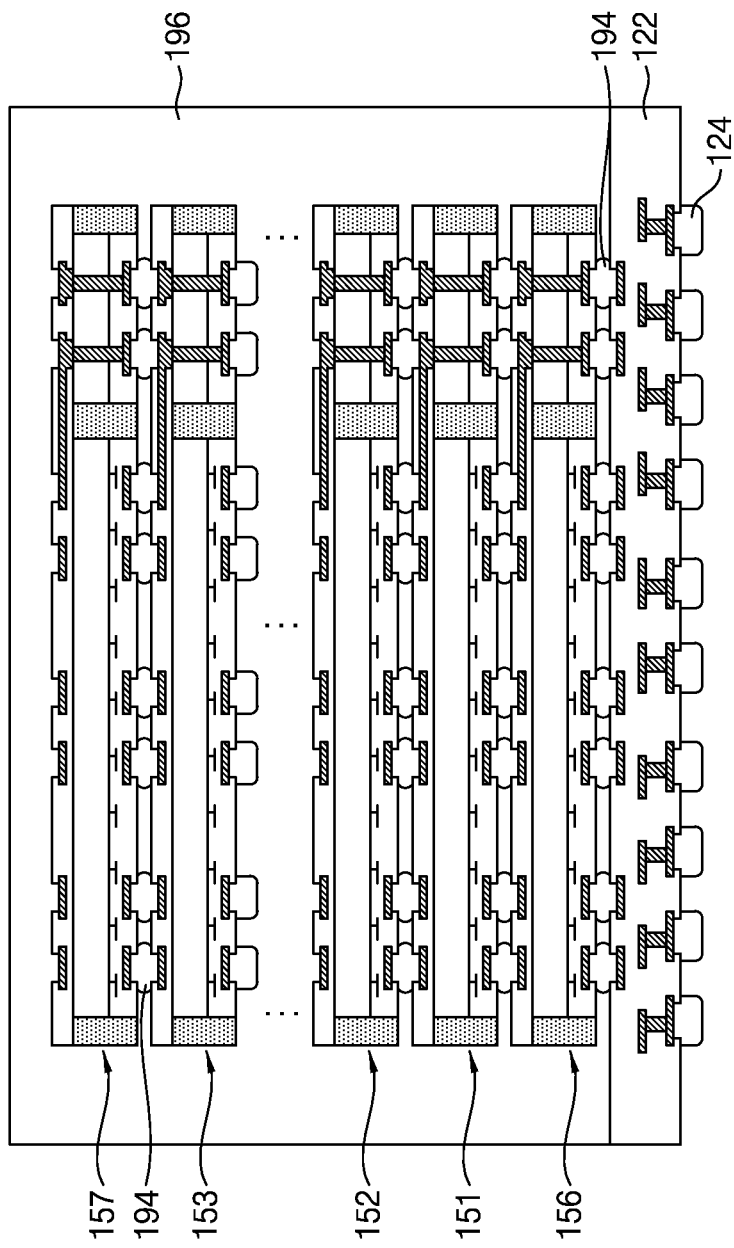

Referring to FIG. 13, the semiconductor packages according to the example embodiments of the disclosure may include a package substrate 122, a plurality of outer connection terminals 124, a first semiconductor package 151, a second semiconductor package 152, a third semiconductor package 153, a sixth semiconductor package 156, a seventh semiconductor package 157, a plurality of inner connection terminals 194, and an outer encapsulator 196.

The sixth semiconductor package 156 may include a configuration similar to the configuration described with reference to FIG. 8. The sixth semiconductor package 156 may be disposed between the first semiconductor package 151 and the package substrate 122. The plurality of inner connection terminals 194 may be disposed between the first semiconductor package 151 and the sixth semiconductor package 156 and between the sixth semiconductor package 156 and the package substrate 122.

In an embodiment, the plurality of chip pads 29 in the first semiconductor package 151 may be electrically connected to the plurality of first through-silicon vias 45 in the sixth semiconductor package 156 via the plurality of inner connection terminals 194, the plurality of redistribution pads 69 in the sixth semiconductor package 156, and the horizontal wiring 68 in the sixth semiconductor package 156. The plurality of chip pads 29 in the second semiconductor package 152 may be electrically connected to the plurality of first through-silicon vias 45 in the first semiconductor package 151 via the plurality of inner connection terminals 194, the plurality of redistribution pads 69 in the first semiconductor package 151, and the horizontal wiring 68 in the first semiconductor package 151.

Figure 14:
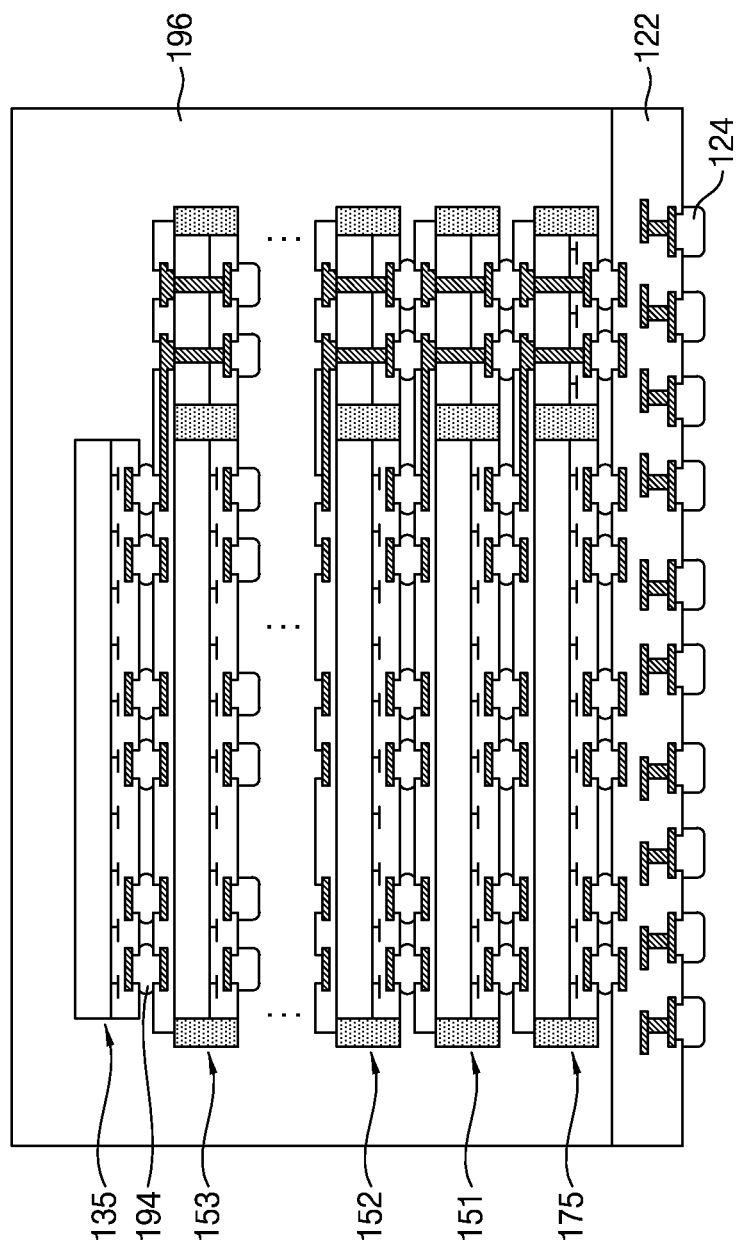

Referring to FIG. 14, the semiconductor packages according to the example embodiments of the disclosure may include a package substrate 122, a plurality of outer connection terminals 124, a first semiconductor package 151, a second semiconductor package 152, a third semiconductor package 153, a fifth semiconductor package 175, a fifth semiconductor chip 135, a plurality of inner connection terminals 194, and an outer encapsulator 196.

Each of the first semiconductor package 151, the second semiconductor package 152, and the third semiconductor package 153 may include a configuration similar to the configuration described with reference to FIG. 9. The fifth semiconductor package 175 may include a configuration similar to the configuration described with reference to FIG. 7. In an embodiment, side surfaces of the redistribution layer 61 may be misaligned from side surfaces of the inner encapsulator 97.

The fifth semiconductor chip 135 may be disposed on the third semiconductor package 153. The plurality of inner connection terminals 194 may be disposed between the fifth semiconductor chip 135 and the third semiconductor package 153. The fifth semiconductor chip 135 may include a configuration similar to that of the third semiconductor chip 21 described with reference to FIG. 2. For example, the fifth semiconductor chip 135 may include a plurality of first chip pads 29 in FIG. 1. The plurality of inner connection terminals 194 may be disposed between the plurality of first chip pads 29 in FIG. 1 of the fifth semiconductor chip 135 and the plurality of redistribution pads 69 in the third semiconductor package 153. An upper surface and side surfaces of the fifth semiconductor chip 135 may directly contact the outer encapsulator 196.

Figure 15:
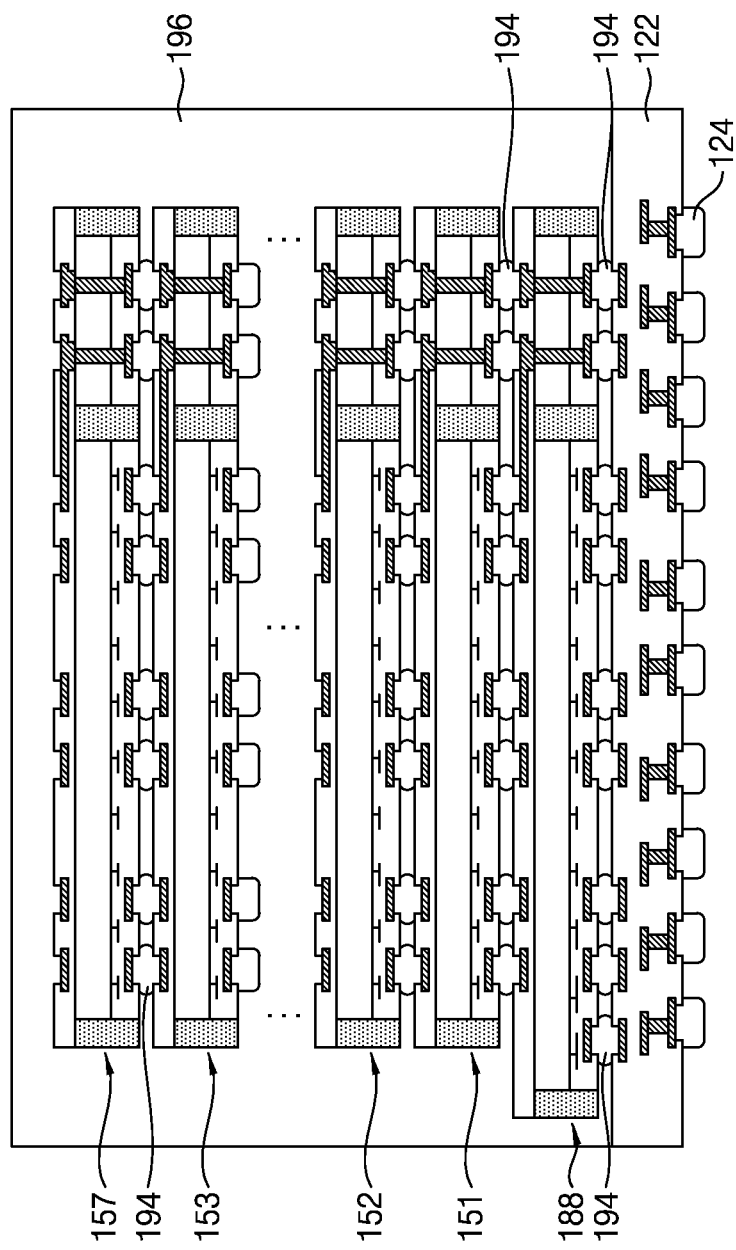

Referring to FIG. 15, the semiconductor packages according to the example embodiments of the disclosure may include a package substrate 122, a plurality of outer connection terminals 124, a first semiconductor package 151, a second semiconductor package 152, a third semiconductor package 153, a seventh semiconductor package 157, an eighth semiconductor package 188, a plurality of inner connection terminals 194, and an outer encapsulator 196. The eighth semiconductor package 188 may be disposed between the first semiconductor package 151 and the second semiconductor package 152.

Referring to FIG. 16, the semiconductor packages according to the example embodiments of the disclosure may include an eighth semiconductor package 188. The eighth semiconductor package 188 may include a sixth semiconductor chip 138, a passive interposer 41, a redistribution layer 61, and an inner encapsulator 97.

The sixth semiconductor chip 138 may include a third semiconductor substrate 123 and a third circuit layer 125. The third semiconductor substrate 123 may include a first surface 123F and a second surface 123B. The third circuit layer 125 may include a third chip insulating layer 127, a plurality of third active/passive devices 128, and a plurality of third chip pads 129.

The sixth semiconductor chip 138 may include a volatile memory, a non-volatile memory, a microprocessor, a buffer chip, an application processor, a logic chip, or a combination thereof. The sixth semiconductor chip 138 may have a size different from that of the third semiconductor chip 21. The sixth semiconductor chip 138 may be a chip of a kind different from that of the third semiconductor chip 21. In an embodiment, the sixth semiconductor chip 138 may include a controller chip, a buffer chip, a logic chip, a microprocessor, an application processor, a graphics processing unit, or a combination thereof.

Again referring to FIGS. 15 and 16, a part of the plurality of redistribution pads 69 in the eighth semiconductor package 188 may be vertically aligned with the plurality of first chip pads 29 in the first semiconductor package 151. A part of the plurality of redistribution pads 69 in the eighth semiconductor package 188 may have substantially the same pitch as the plurality of first chip pads 29 in the first semiconductor package 151.

FIGS. 17, 18, 19, 20, 21, 22 and 23 are sectional views of semiconductor package formation methods according to example embodiments.

Referring to FIG. 17, a third semiconductor chip 21 and a passive interposer 41 may be seated on a first carrier 225. In an embodiment, seating the third semiconductor chip 21 and the passive interposer 41 on the first carrier 225 may be performed using a first wafer support system (WSS).

The third semiconductor chip 21 may include a first semiconductor substrate 23 and a first circuit layer 25. The first semiconductor substrate 23 may include a silicon wafer, a silicon-on-insulator (SOI) wafer, a compound semiconductor wafer, or a combination thereof. The first semiconductor substrate 23 may include a first surface 23F, and a second surface 23B opposing the first surface 23F. The first surface 23F may correspond to a front surface, and the second surface 23B may correspond to a back surface.

The first circuit layer 25 may be formed on the first surface 23F. The first circuit layer 25 may include a first chip insulating layer 27, a plurality of first active/passive devices 28, and a plurality of first chip pads 29. The third semiconductor chip 21 may be attached such that the first surface 23F is directed toward an upper surface of the first carrier 225. The first circuit layer 25 may be disposed between the first carrier 225 and the first semiconductor substrate 23.

The first chip insulating layer 27 may be formed on the first surface 23F. The first chip insulating layer 27 may include a single layer or multiple layers. The first chip insulating layer 27 may include at least two selected from the group including Si, O, N, C, H, and B. The first chip insulating layer 27 may include silicon oxide, silicon nitride, silicon oxynitride, silicon boron nitride (SiBN), silicon carbon nitride (SiCN), low-k dielectrics, high-k dielectrics, or a combination thereof.

The plurality of first active/passive devices 28 may be formed in the first chip insulating layer 27. The plurality of first chip pads 29 may be formed in the first chip insulating layer 27. The plurality of first chip pads 29 may be electrically connected to the plurality of first active/passive devices 28. The plurality of first chip pads 29 may include Al, Cu, Ag, MN, Au, Be, Bi, Co, Hf, In, Mn, Mo, Ni, Pb, Pd, Pt, Rh, Re, Ru, Sn, Ta, TaN, Te, Ti, TiN, W, WN, Zn, Zr, or a combination thereof.

The passive interposer 41 may include an interposer substrate 43, a plurality of first through-silicon vias 45, an interposer insulating layer 47, and a plurality of interposer pads 49. The interposer substrate 43 may include a front surface 43F, and a back surface 43B opposing the front surface 43F.

The interposer substrate 43 may include a semiconductor substrate such as a silicon wafer, an SOI wafer, a compound semiconductor wafer, or a combination thereof. The interposer substrate 43 may include a semiconductor substrate, a printed circuit board, a ceramic substrate, a glass plate, or a combination thereof. In an embodiment, the interposer substrate 43 may include substantially the same material as the first semiconductor substrate 23. The interposer substrate 43 may include a dummy chip, a dummy wafer, a reclaimed wafer, or a test wafer.

The plurality of first through-silicon vias 45 may extend into the interposer substrate 43. The interposer insulating layer 47 may be formed on the front surface 43F. The plurality of interposer pads 49 may be formed in the interposer insulating layer 47. Each of the plurality of interposer pads 49 may be connected to a corresponding one of the plurality of first through-silicon vias 45.

The passive interposer 41 may be seated on the first carrier 225 adjacent to the third semiconductor chip 21. The passive interposer 41 may be spaced apart from the third semiconductor chip 21. The passive interposer 41 may be attached such that the front surface 43F is directed toward the upper surface of the first carrier 225. The interposer insulating layer 47 and the plurality of interposer pads 49 may be disposed between the first carrier 225 and the interposer substrate 43.

The interposer insulating layer 47 may include a single layer or multiple layers. The interposer insulating layer 47 may include at least two selected from the group including Si, O, N, C, H, and B. The interposer insulating layer 47 may include silicon oxide, silicon nitride, silicon oxynitride, silicon boron nitride (SiBN), silicon carbon nitride (SiCN), low-k dielectrics, high-k dielectrics, or a combination thereof.

Each of the plurality of first through-silicon vias 45 and the plurality of interposer pads 49 may include Cu, Ag, Al, AlN, Au, Be, Bi, Co, Hf, In, Mn, Mo, Ni, Pb, Pd, Pt, Rh, Re, Ru, Sn, Ta, TaN, Te, Ti, TiN, W, WN, Zn, Zr, or a combination thereof. For example, each of the plurality of first through-silicon vias 45 and the plurality of interposer pads 49 may include a Cu layer formed by an electroplating method.

Figure 18:
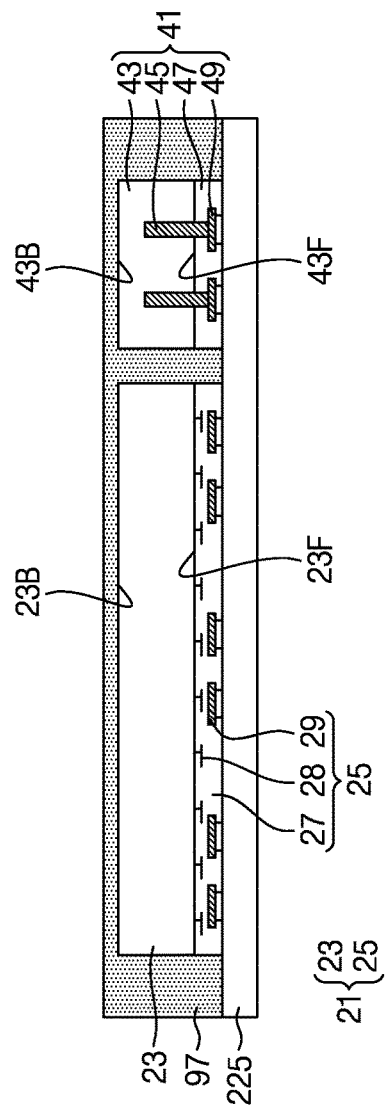

Referring to FIG. 18, an inner encapsulator 97 covering the third semiconductor chip 21 and the passive interposer 41 may be formed on the first carrier 225. The inner encapsulator 97 may be filled between the third semiconductor chip 21 and the passive interposer 41, and may cover side surfaces of the third semiconductor chip 21 and the passive interposer 41. The inner encapsulator 97 may include an epoxy molding compound (EMC).

Figure 19:
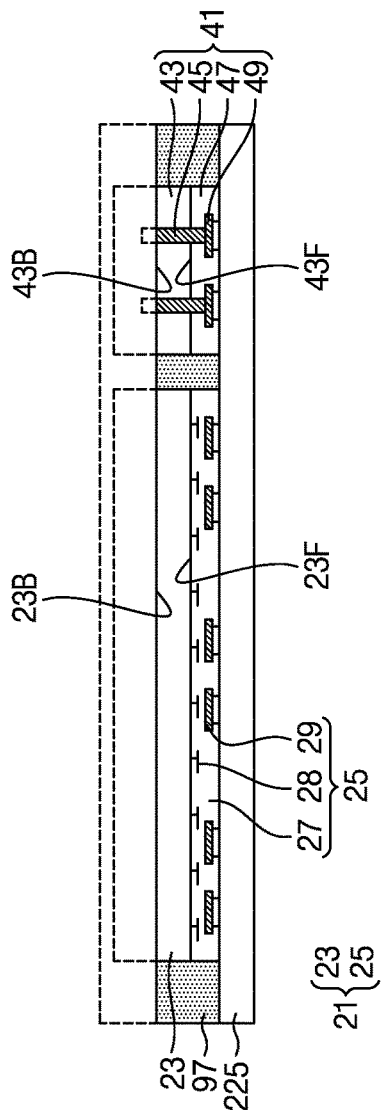

Referring to FIG. 19, the inner encapsulator 97, the first semiconductor substrate 23, and the interposer substrate 43 may be partially removed, thereby exposing the plurality of first through-silicon vias 45. Each of the first semiconductor substrate 23 and the interposer substrate 43 may be reduced in thickness. The second surface 23B of the first semiconductor substrate 23, the back surface 43B of the interposer substrate 43, the plurality of first through-silicon vias 45, and an upper surface of the inner encapsulator 97 may be exposed on substantially the same plane.

Referring to FIG. 20, a redistribution layer 61 may be formed on the second surface 23B of the first semiconductor substrate 23, the back surface 43B of the interposer substrate 43, the plurality of first through-silicon vias 45, and the upper surface of the inner encapsulator 97. The redistribution layer 61 may include a redistribution insulating layer 67, a horizontal wiring 68, and a plurality of redistribution pads 69.

The redistribution insulating layer 67 may cover the second surface 23B of the first semiconductor substrate 23, the back surface 43B of the interposer substrate 43, and the upper surface of the inner encapsulator 97. The horizontal wiring 68 and the plurality of redistribution pads 69 may be formed in the redistribution insulating layer 67. The horizontal wiring 68 may contact the plurality of first through-silicon vias 45. The plurality of redistribution pads 69 may be connected to the horizontal wiring 68. The plurality of redistribution pads 69 may be electrically connected to the plurality of first through-silicon vias 45 via the horizontal wiring 68. One surface of each of the plurality of redistribution pads 69 may be exposed.

In an embodiment, the plurality of redistribution pads 69 may be aligned to face the plurality of first chip pads 29 and the plurality of interposer pads 49. A part of the plurality of redistribution pads 49 may have substantially the same pitch as the plurality of first chip pads 29. The center of each of the plurality of first chip pads 29 may be vertically aligned with the center of a corresponding one of the plurality of redistribution pads 69. The center of each of the plurality of interposer pads 49 may be vertically aligned with the center of the corresponding one of the plurality of redistribution pads 69.

The redistribution insulating layer 67 may include a single layer or multiple layers. The redistribution insulating layer 67 may include at least two selected from the group including Si, O, N, C, H, and B. The redistribution insulating layer 67 may include silicon oxide, silicon nitride, silicon oxynitride, SiBN, SiCN, low-k dielectrics, high-k dielectrics, or a combination thereof.

The horizontal wiring 68 and the plurality of redistribution pads 69 may include Cu, Ag, Al, AlN, Au, Be, Bi, Co, Hf, In, Mn, Mo, Ni, Pb, Pd, Pt, Rh, Re, Ru, Sn, Ta, TaN, Te, Ti, TiN, W, WN, Zn, Zr, or a combination thereof. For example, the horizontal wiring 68 and the plurality of redistribution pads 69 may include a Cu layer formed by an electroplating method.

Referring to FIG. 21, the first carrier 225 may be removed, and may then be attached to the redistribution layer 61 in plan view. In an embodiment, attachment of the second carrier 235 to the redistribution layer 61 may be performed using a second WSS. The plurality of first chip pads 29 and the plurality of interposer pads 49 may be exposed.

Figure 22:
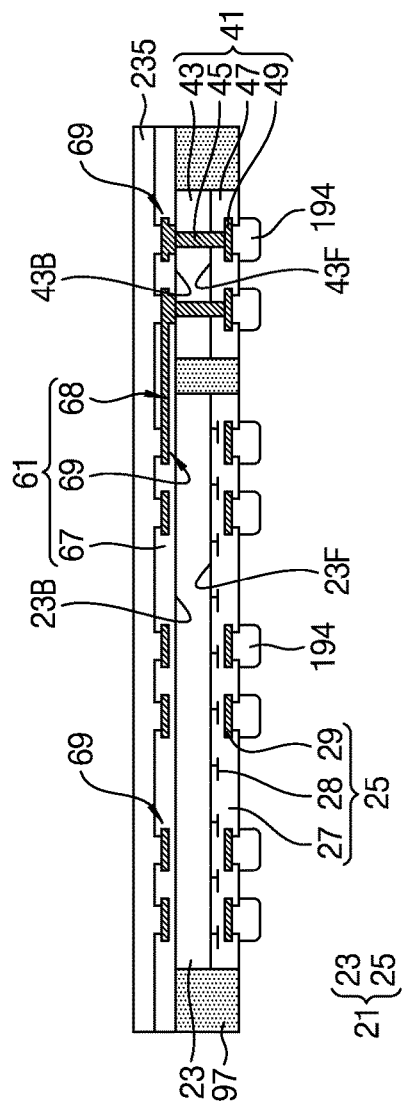

Referring to FIG. 22, a plurality of inner connection terminals 194 may be formed on the plurality of first chip pads 29 and the plurality of interposer pads 49. The plurality of inner connection terminals 194 may include Sn, Ag, Cu, Al, AlN, Au, Be, Bi, Co, Hf, In, Mn, Mo, Ni, Pb, Pd, Pt, Rh, Re, Ru, Ta, TaN, Te, Ti, TiN, W, WN, Zn, Zr, or a combination thereof. The plurality of inner connection terminals 194 may include a conductive bump, a conductive ball, a conductive pin, a conductive lead, a conductive pillar, or a combination thereof. For example, each of the plurality of inner connection terminals 194 may include a UBM and a conductive bump.

Figure 23:
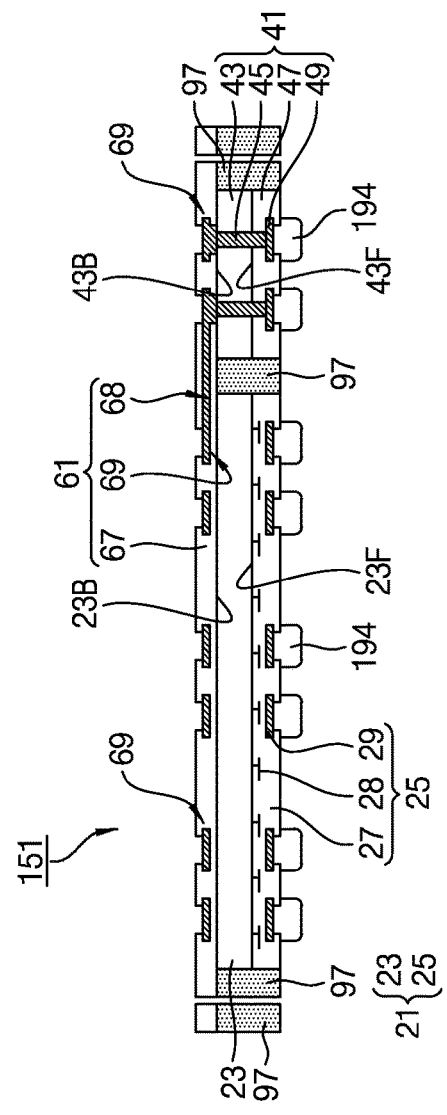

Referring to FIG. 23, the inner encapsulator 97 and the redistribution layer 61 may be cut, thereby separating a first semiconductor package 151. In an embodiment, side surfaces of the inner encapsulator 97 and the redistribution layer 61 may be substantially coplanar. The second carrier 235 may be removed, thereby exposing the plurality of redistribution pads 69.

Cutting of the inner encapsulator 97 and the redistribution layer 61 may be performed using various kinds of dicing processes. In an embodiment, cutting of the inner encapsulator 97 may include a blade sawing process, a laser sawing process, a bevel cutting process, or a combination thereof.

Figure 24:
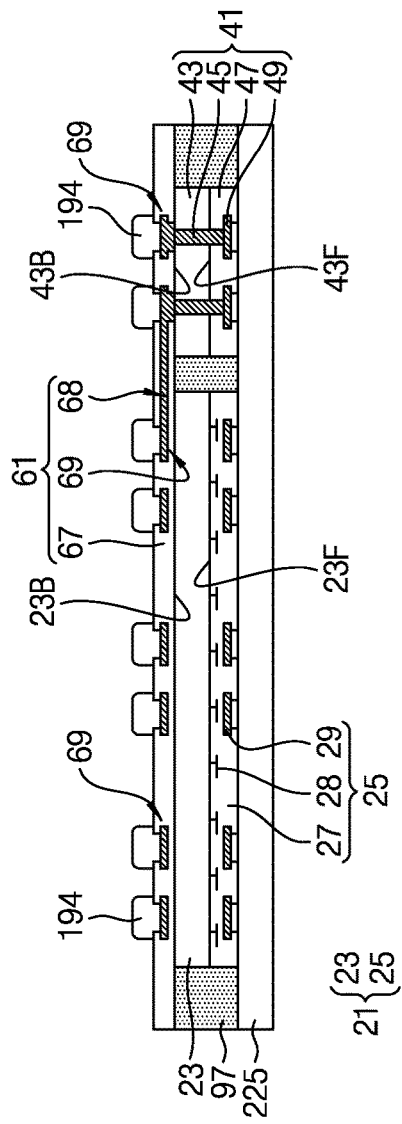
Figure 25:
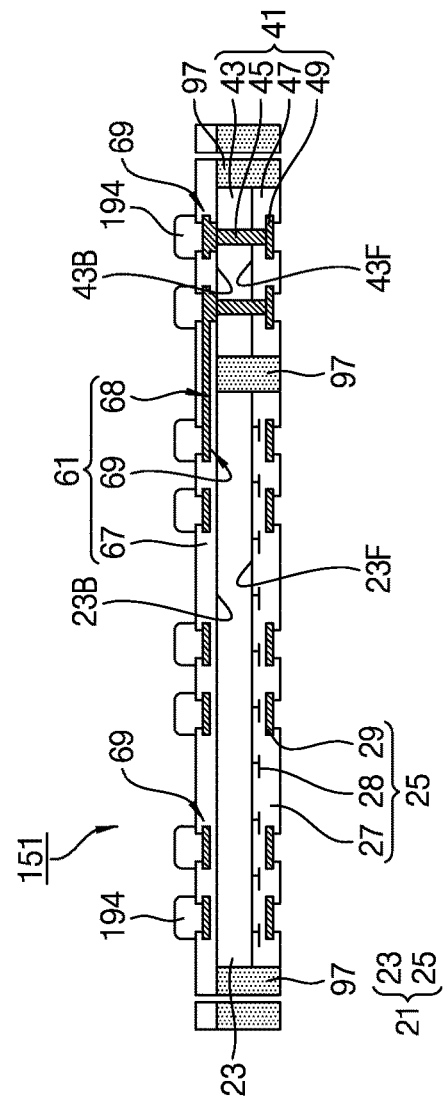

FIGS. 24 and 25 are sectional views of semiconductor package formation methods according to example embodiments.

Referring to FIG. 24, the plurality of inner connection terminals 194 may be formed on the plurality of redistribution pads 69 before removal of the first carrier 225.

Referring to FIG. 25, the inner encapsulator 97 and the redistribution layer 61 may be cut, thereby separating a first semiconductor package 151. The first carrier 225 may be removed, thereby exposing the plurality of first chip pads 29 and the plurality of interposer pads 49.

FIGS. 26, 27, 28, 29, 30 and 31 are sectional views of semiconductor package formation methods according to example embodiments.

Figure 26:
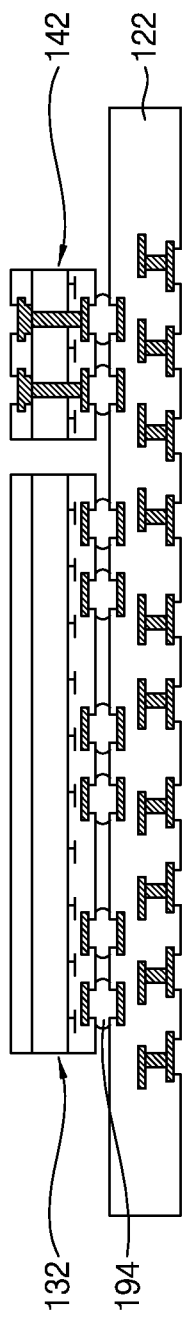

Referring to FIG. 26, a first semiconductor chip 132 and a second semiconductor chip 142 may be mounted on a package substrate 122. A plurality of inner connection terminals 194 may be formed between the first semiconductor chip 132 and the package substrate 122 and between the second semiconductor chip 142 and the package substrate 122.

Figure 27:
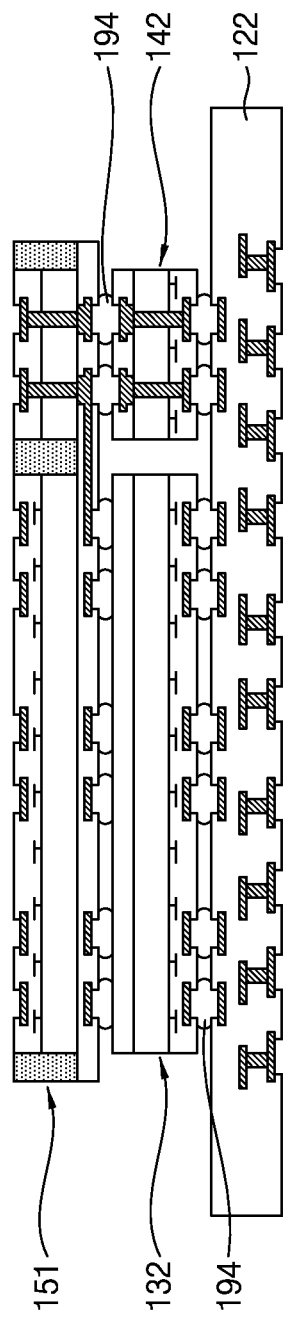

Referring to FIG. 27, a first semiconductor package 151 may be mounted on the first semiconductor chip 132 and the second semiconductor chip 142. A plurality of inner connection terminals 194 may be formed between the first semiconductor package 151 and the first semiconductor chip 132 and between the first semiconductor package 151 and the second semiconductor chip 142.

Figure 28:
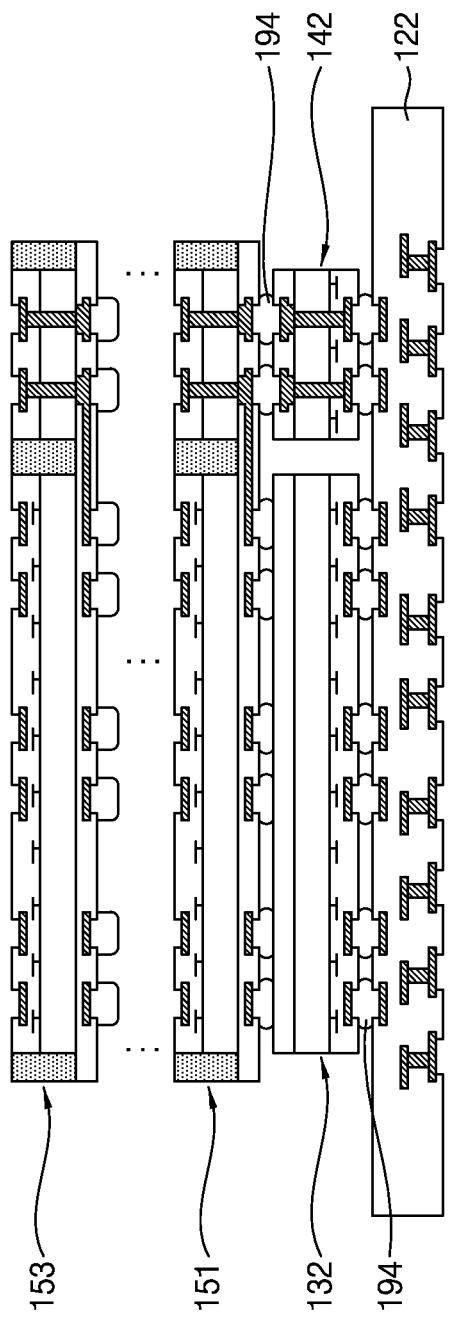

Referring to FIG. 28, a third semiconductor package 153 may be mounted on the first semiconductor package 151. A plurality of other packages may be additionally mounted between the first semiconductor package 151 and the third semiconductor package 153.

Figure 29:
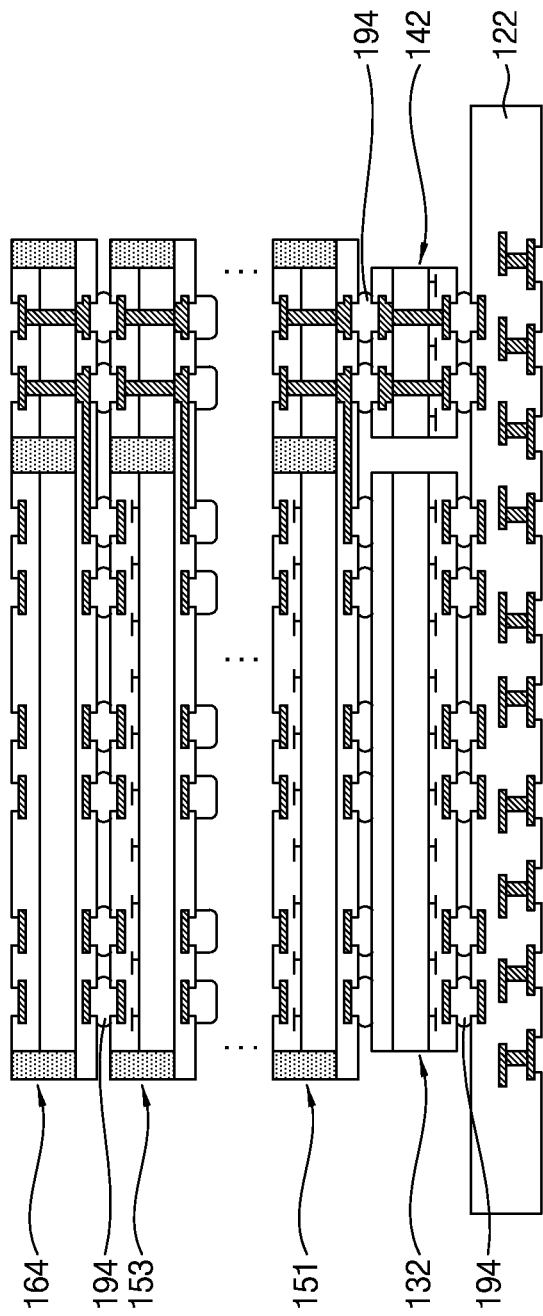

Referring to FIG. 29, a fourth semiconductor package 164 may be mounted on the third semiconductor package 153.

Figure 30:
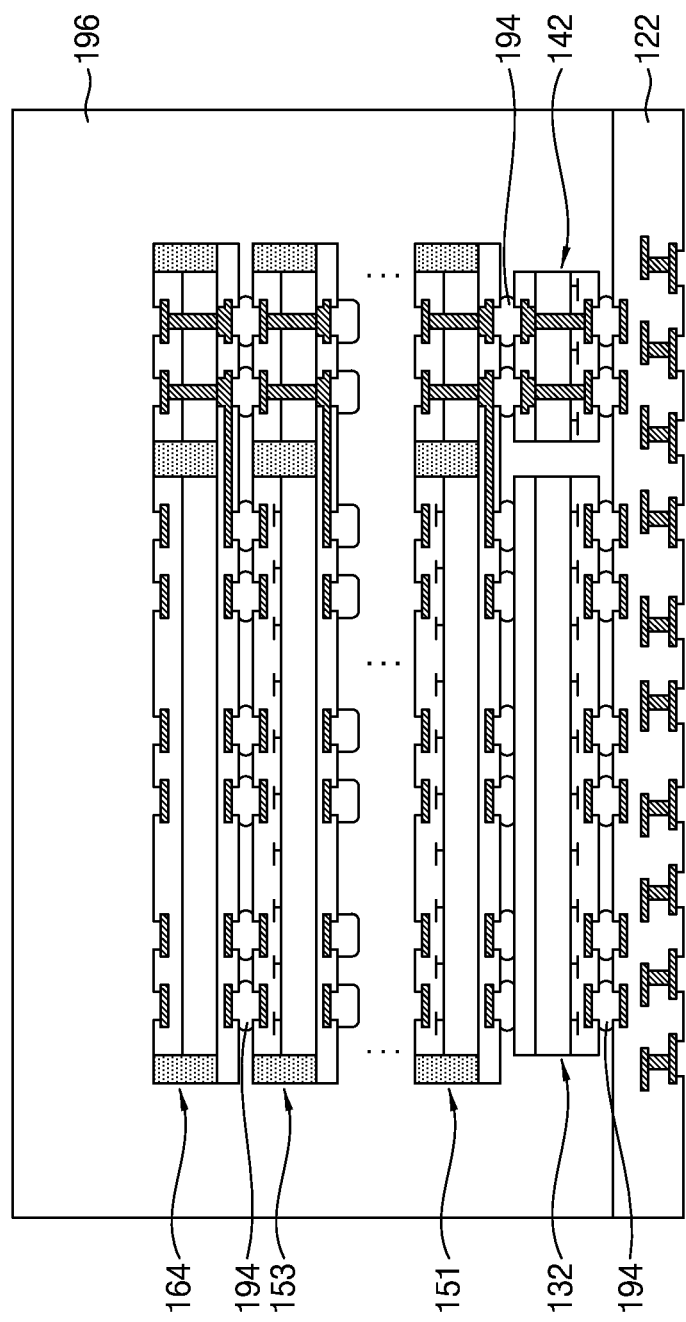

Referring to FIG. 30, an outer encapsulator 196 covering the first semiconductor chip 132, the second semiconductor chip 142, the first semiconductor package 151, the third semiconductor package 153 and the fourth semiconductor package 164 may be formed on the package substrate 122. The outer encapsulator 196 may include an epoxy molding compound (EMC).

Figure 31:
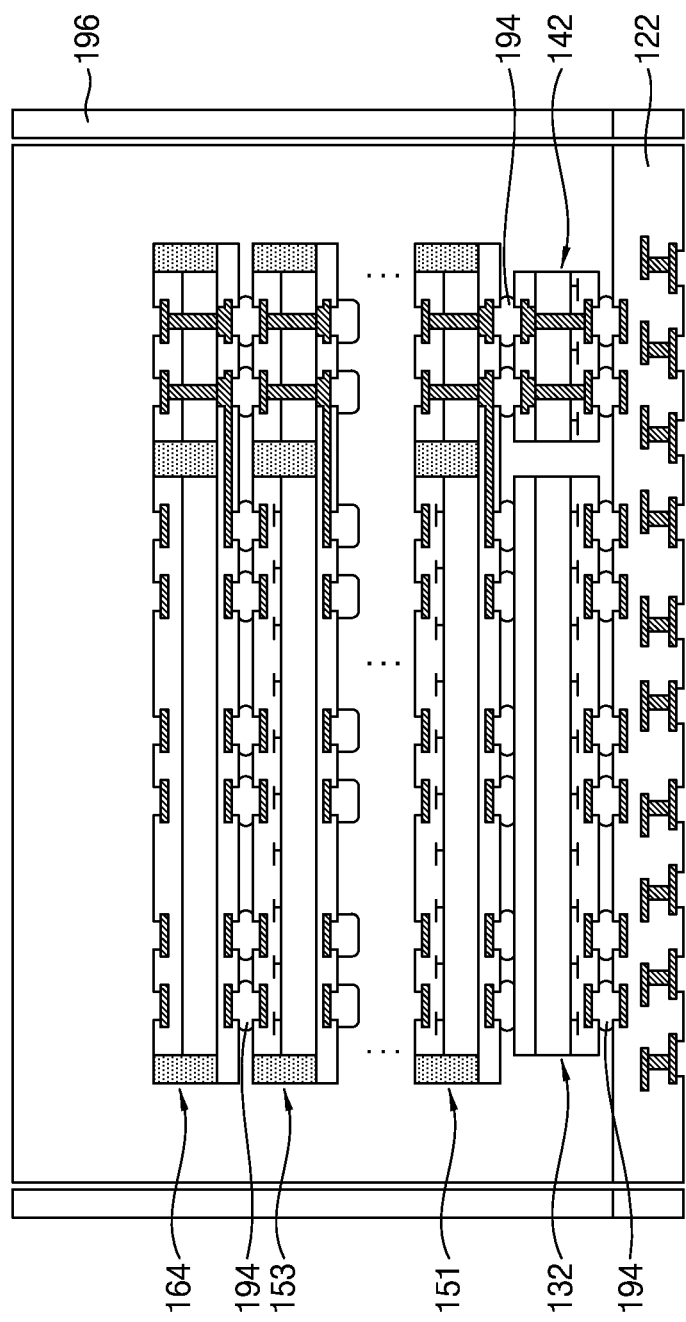

Referring to FIG. 31, the outer encapsulator 196 and the package substrate 122 may be cut, thereby separating a semiconductor package.

In accordance with the example embodiments of the disclosure, a semiconductor package including a plurality of semiconductor chips, an interposer including a plurality of through-silicon vias, and a redistribution layer may be provided. A semiconductor package having excellent electrical characteristics while being advantageous in terms of lightness, thinness, simplification and miniaturization may be realized.

While example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
    a package substrate; and
    a plurality of sub-packages provided on the package substrate,
    wherein each sub-package of the plurality of sub-packages comprises:
        a semiconductor chip;
        an interposer provided adjacent to the semiconductor chip, the interposer comprising a plurality of first through-silicon vias;
        an encapsulator provided between the semiconductor chip and the interposer; and
        a redistribution layer contacting the interposer, the encapsulator and the semiconductor chip,
    wherein the semiconductor chip comprises:
        a semiconductor substrate having a first surface and a second surface opposite the first surface; and
        a plurality of chip pads provided on the first surface,
    wherein the redistribution layer comprises:
        a plurality of redistribution pads; and
        a horizontal wiring provided between the plurality of redistribution pads and the plurality of first through-silicon vias,
    wherein the redistribution layer is provided on the second surface of the semiconductor substrate, and extends on the encapsulator and the interposer, and
    wherein the redistribution layer further comprises a redistribution insulating layer, and the horizontal wiring extends at least partially through the redistribution insulating layer.

2. The semiconductor package of claim 1, wherein the interposer comprises a passive interposer.

3. The semiconductor package of claim 1, wherein the interposer does not comprise an active device or comprises a deactivated active device that is electrically separated from the plurality of first through-silicon vias.

4. The semiconductor package of claim 1, wherein the interposer comprises an interposer substrate;
    wherein the plurality of first through-silicon vias extends through the interposer substrate; and
    wherein the interposer substrate comprises a material that is substantially the same as a material of the semiconductor substrate.

5. The semiconductor package of claim 1, wherein each chip pad of the plurality of chip pads is aligned with a corresponding one of the plurality of redistribution pads.

6. The semiconductor package of claim 5, wherein the plurality of chip pads has a pitch that is substantially the same as a pitch of the plurality of redistribution pads.

7. The semiconductor package claim 1, further comprising:
    a plurality of inner connection terminals,
    wherein the plurality of sub-packages comprises:
        a first semiconductor sub-package; and
        a second semiconductor sub-package provided on the first semiconductor sub-package, and
    wherein the plurality of inner connection terminals is provided between the first semiconductor sub-package and the second semiconductor sub-package and between the first semiconductor sub-package and the package substrate.

8. The semiconductor package of claim 7, wherein the plurality of chip pads of the first semiconductor sub-package is electrically connected to the plurality of first through-silicon vias of the first semiconductor sub-package by the plurality of inner connection terminals, the plurality of redistribution pads of the second semiconductor sub-package, and the horizontal wiring of the second semiconductor sub-package.

9. The semiconductor package of claim 7, wherein the plurality of chip pads of the second semiconductor sub-package is electrically connected to the plurality of first through-silicon vias of the first semiconductor sub-package by the plurality of inner connection terminals, the plurality of redistribution pads of the first semiconductor sub-package, and the horizontal wiring of the first semiconductor sub-package.

10. The semiconductor package of claim 9, wherein the plurality of inner connection terminals is provided between the plurality of chip pads of the first semiconductor sub-package and the package substrate, and
    wherein the plurality of inner connection terminals is provided between the plurality of first through-silicon vias of the first semiconductor sub-package and the package substrate.

11. The semiconductor package of claim 9, wherein the plurality of sub-packages further comprises a third semiconductor sub-package provided on the second semiconductor sub-package,
    wherein the plurality of inner connection terminals is provided between the third semiconductor sub-package and the second semiconductor sub-package, and
    wherein the plurality of chip pads of the third semiconductor sub-package is electrically connected to the plurality of first through-silicon vias of the first semiconductor sub-package by the plurality of inner connection terminals, the plurality of redistribution pads of the second semiconductor sub-package, the horizontal wiring of the second semiconductor sub-package, and the plurality of first through-silicon vias of the second semiconductor sub-package.

12. The semiconductor package of claim 1, wherein the plurality of sub-packages comprises a first semiconductor sub-package provided between the package substrate and remaining sub-packages of the plurality of sub-packages,
    wherein the semiconductor chip of the first semiconductor sub-package comprises:
        a first semiconductor chip; and
        a second semiconductor chip provided adjacent to the first semiconductor chip, the second semiconductor chip comprising a plurality of second through-silicon vias,
    wherein the encapsulator of the first semiconductor sub-package is provided between the first semiconductor chip and the second semiconductor chip, and
    wherein the redistribution layer of the first semiconductor sub-package is provided on the first semiconductor chip, the encapsulator of the first semiconductor sub-package and the second semiconductor chip.

13. The semiconductor package of claim 12, wherein the second semiconductor chip further comprises a plurality of active devices connected to the plurality of second through-silicon vias.

14. A semiconductor package comprising:
    a package substrate;
    a first semiconductor chip provided on the package substrate;
    a second semiconductor chip provided on the package substrate adjacent to the first semiconductor chip; and
    a plurality of sub-packages provided on the first semiconductor chip and the second semiconductor chip, wherein each sub-package of the plurality of sub-packages comprises:
a third semiconductor chip;
a passive interposer provided adjacent to the third semiconductor chip, the passive interposer comprising a plurality of first through-silicon vias;
an encapsulator provided between the third semiconductor chip and the passive interposer; and
a redistribution layer contacting the passive interposer, the encapsulator and the third semiconductor chip,
wherein the third semiconductor chip comprises:
a semiconductor substrate having a first surface and a second surface opposite the first surface; and
a plurality of chip pads provided on the first surface,
wherein the redistribution layer comprises:
a plurality of redistribution pads; and
a horizontal wiring provided between the plurality of redistribution pads and the plurality of first through-silicon vias,
wherein the redistribution layer is provided on the second surface of the semiconductor substrate, and extends on the encapsulator and the passive interposer, and
wherein the redistribution layer further comprises a redistribution insulating layer, and the horizontal wiring extends at least partially through the redistribution insulating layer.

15. The semiconductor package of claim 14, wherein the second semiconductor chip comprises a plurality of second through-silicon vias, and
wherein the plurality of first through-silicon vias is electrically connected to the plurality of second through-silicon vias.

16. The semiconductor package claim 15, wherein the second semiconductor chip further comprises a plurality of active devices connected to the plurality of second through-silicon vias.

17. The semiconductor package of claim 15, further comprising a plurality of inner connection terminals,
wherein the plurality of sub-packages comprises:
a first semiconductor sub-package, and
a second semiconductor sub-package provided on the first semiconductor sub-package, and
wherein the plurality of inner connection terminals is provided between the first semiconductor chip and the package substrate, between the plurality of second through-silicon vias and the package substrate, between the plurality of first through-silicon vias and the plurality of second through-silicon vias, and between the first semiconductor sub-package and the second semiconductor sub-package.

18. The semiconductor package of claim 17, wherein the plurality of chip pads of the first semiconductor sub-package is configured to be electrically connected to the plurality of first through-silicon vias of the first semiconductor sub-package by the plurality of inner connection terminals, the plurality of redistribution pads of the second semiconductor sub-package, and the horizontal wiring of the second semiconductor sub-package.

19. A semiconductor package comprising:
a first sub-package;
a second sub-package on the first sub-package;
an outer encapsulator disposed between the first sub-package and the second sub-package,
wherein each of the first sub-package and the second sub-package comprises:
a semiconductor chip;
a passive interposer provided adjacent to the semiconductor chip, the passive interposer comprising a plurality of through-silicon vias;
an encapsulator provided between the semiconductor chip and the passive interposer; and
a redistribution layer provided on the passive interposer, the encapsulator and the semiconductor chip,
wherein the semiconductor chip comprises:
a semiconductor substrate comprising a first surface, and a second surface opposite the first surface; and
a plurality of chip pads on the first surface,
wherein the redistribution layer comprises:
a plurality of redistribution pads; and
a horizontal wiring provided between the plurality of redistribution pads and the plurality of through-silicon vias,
wherein the redistribution layer is provided on the second surface of the semiconductor substrate, and extends on the encapsulator and the passive interposer, and
wherein each chip pad of the plurality of chip pads is aligned with a corresponding redistribution pad of the plurality of redistribution pads.

20. The semiconductor package of claim 19, wherein the plurality of chip pads has a pitch that is substantially the same as a pitch of the plurality of redistribution pads.

* * * * *